(12) United States Patent
Mishra et al.

(10) Patent No.: US 11,152,567 B2
(45) Date of Patent: Oct. 19, 2021

(54) PHASE CHANGE MEMORY STRUCTURES

(71) Applicant: Intel Corporation, Santa Clara, CA (US)

(72) Inventors: Maneesh Mishra, Boise, ID (US); Mihir H. Bohra, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/619,059

(22) PCT Filed: Jul. 1, 2017

(86) PCT No.: PCT/US2017/040558
§ 371 (c)(1),
(2) Date: Dec. 3, 2019

(87) PCT Pub. No.: WO2019/009877
PCT Pub. Date: Jan. 10, 2019

(65) Prior Publication Data
US 2020/0119271 A1    Apr. 16, 2020

(51) Int. Cl.
*H01L 45/00* (2006.01)
*H01L 27/24* (2006.01)

(52) U.S. Cl.
CPC ...... *H01L 45/1253* (2013.01); *H01L 27/2409* (2013.01); *H01L 45/06* (2013.01); *H01L 45/1233* (2013.01); *H01L 45/141* (2013.01); *H01L 45/1608* (2013.01)

(58) Field of Classification Search
CPC ............. H01L 27/2436; H01L 27/2472; H01L 27/2481; H01L 27/2427; H01L 27/2454; H01L 45/06; H01L 45/1273; H01L 45/144; H01L 45/1666
See application file for complete search history.

(56) References Cited

U.S. PATENT DOCUMENTS

| | | | | |
|---|---|---|---|---|
| 7,323,734 B2* | 1/2008 | Ha | ............ | H01L 45/06 257/296 |
| 7,372,726 B2* | 5/2008 | Matsuoka | .......... | G11C 13/0069 365/163 |
| 7,402,851 B2* | 7/2008 | Hideki | ............. | G11C 13/0004 257/2 |
| 7,892,936 B1* | 2/2011 | Wu | .............. | H01L 27/2427 438/385 |
| 7,968,876 B2* | 6/2011 | Lung | .............. | H01L 45/144 257/42 |
| 10,084,016 B2* | 9/2018 | Donghi | ............. | H01L 27/2463 |
| 2004/0166604 A1* | 8/2004 | Ha | ............. | H01L 45/122 438/102 |

(Continued)

*Primary Examiner* — Nikolay K Yushin
(74) *Attorney, Agent, or Firm* — Alliance IP, LLC

(57) ABSTRACT

A phase change memory structure (100) can include a memory cell, a dielectric material (130) adjacent to the memory cell, and a bit line. The memory cell can include a phase change material layer (110) and a top electrode layer (120) above the phase change material layer. The dielectric material can have a top surface (135) that is higher than a top surface (125) of the top electrode layer. The bit line (140) can have a non-flat bottom surface that contacts the top surface of the dielectric material and protrudes down from the top surface of the dielectric material to a top surface of the memory cell.

27 Claims, 9 Drawing Sheets

(56) References Cited

U.S. PATENT DOCUMENTS

| | | | |
|---|---|---|---|
| 2005/0002227 A1* | 1/2005 | Hideki | H01L 45/06 365/163 |
| 2007/0217254 A1* | 9/2007 | Matsuoka | G11C 13/0004 365/163 |
| 2008/0075844 A1 | 3/2008 | Ha et al. | |
| 2008/0248632 A1 | 10/2008 | Youn et al. | |
| 2009/0101882 A1 | 4/2009 | Chen et al. | |
| 2009/0258477 A1 | 10/2009 | Ryoo et al. | |
| 2010/0295123 A1* | 11/2010 | Lung | H01L 27/2454 257/334 |
| 2011/0020998 A1 | 1/2011 | Oh et al. | |
| 2011/0210302 A1 | 9/2011 | Tsukada et al. | |
| 2015/0137061 A1* | 5/2015 | Donghi | H01L 45/1233 257/4 |
| 2016/0233271 A1 | 8/2016 | Pellizzer et al. | |

* cited by examiner

PHASE CHANGE MEMORY STRUCTURES

PRIORITY INFORMATION

This application is a 371 U.S. national stage entry of PCT Application Serial No. PCT/US2017/040558, filed Jul. 1, 2017, which is incorporated herein by reference in its entirety.

BACKGROUND

Phase change materials have properties that invite their use in a number of applications such as ovonic threshold switches and phase change memory (PCM). Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store binary information. Each state is designated a different binary value, and once stored, information can be read by detecting the electrical resistance of the material. The fact that each state persists once fixed makes PCM a valuable non-volatile memory (NVM) type.

DESCRIPTION OF EMBODIMENTS

Figure 1:
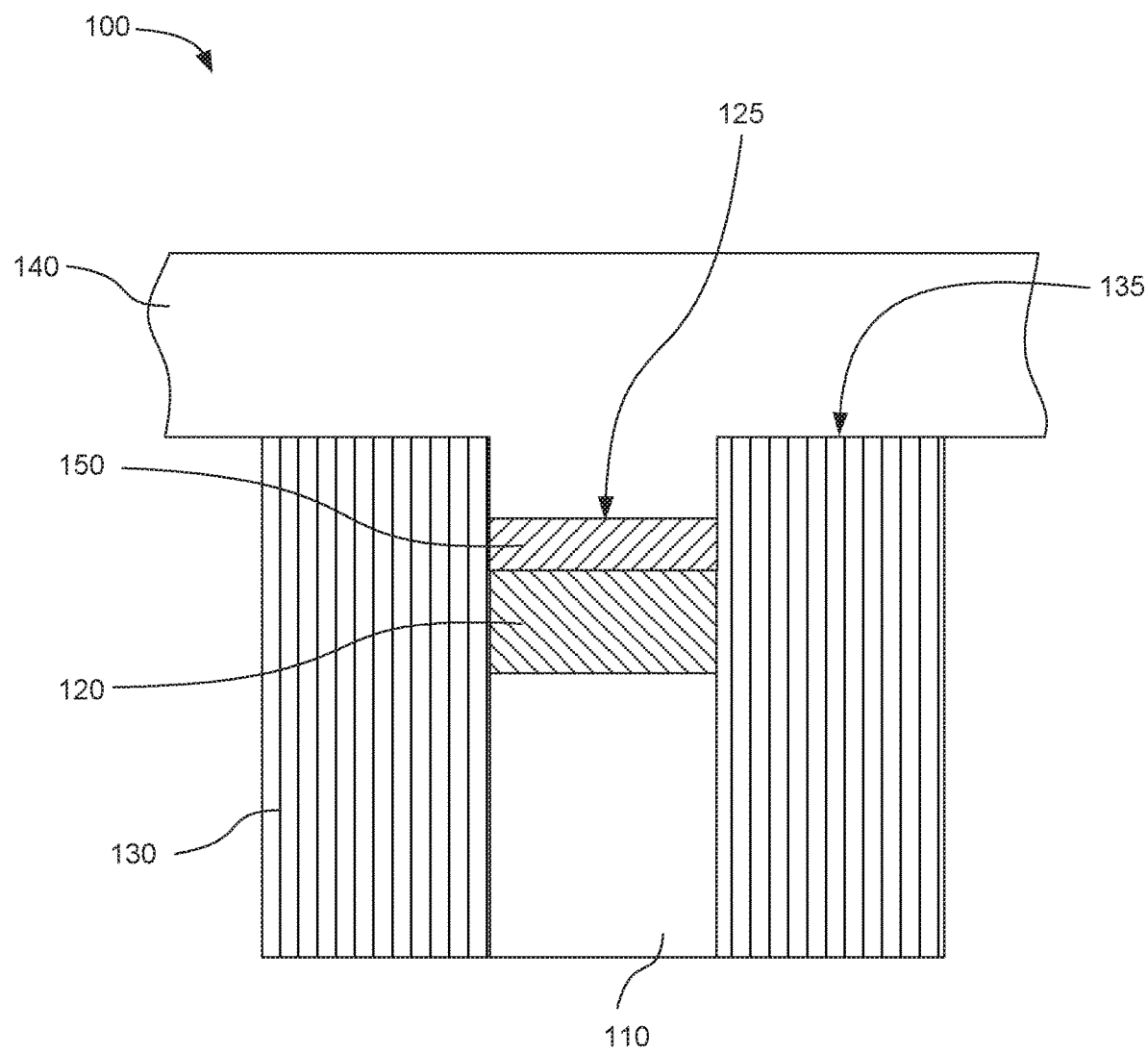
FIG. 1 is a cross-sectional view of an example phase change memory structure in accordance with an example embodiment.

Although the following detailed description contains many specifics for the purpose of illustration, a person of ordinary skill in the art will appreciate that many variations and alterations to the following details can be made and are considered included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

In this application, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, "enhanced," "improved," "performance-enhanced," "upgraded," and the like, when used in connection with the description of a device or process, refers to a characteristic of the device or process that provides measurably better form or function as compared to previously known devices or processes. This applies to both the form and function of individual components in a device or process, as well as to such devices or processes as a whole.

As used herein, "coupled" refers to a relationship of physical connection or attachment between one item and another item, and includes relationships of either direct or indirect connection or attachment. Any number of items can be coupled, such as materials, components, structures, layers, devices, objects, etc.

As used herein, "directly coupled" refers to a relationship of physical connection or attachment between one item and another item where the items have at least one point of direct physical contact or otherwise touch one another. For example, when one layer of material is deposited on or against another layer of material, the layers can be said to be directly coupled.

Objects or structures described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific technology embodiments are then described in further detail. This initial summary is intended to aid readers in understanding the technology more quickly, but is not intended to identify key or essential technological features, nor is it intended to limit the scope of the claimed subject matter.

Phase change memory arrays have been developed to include many memory cells connected to bit lines and word lines. In many cases, each phase change memory cell is made up of a number of layers of different materials. One of the layers is typically a phase change material, while other layers can include electrodes, select device materials, diffusion barrier materials, thermal insulating materials, and so on. In some cases, individual memory cells can be separated by dielectric materials to electrically insulate the memory cells one from another. Bit lines and word lines can be line of metal deposited along columns and rows of memory cells to allow the memory cells to be individually addressable. Addition structures are sometimes incorporated into memory array such as conductive vias that penetrate through the substrate on which the memory array is formed.

The various material layers and structures that make up a phase change memory array can present various manufacturing challenges. It can often be desirable to make these structures as small as possible in order to make high-density memory. However, this can be balanced against processing limitations and the need for consistent and reliable memory operation. In certain types of phase change memory, the memory cells can include at least a phase change material layer and a top electrode layer above the phase change material layer. A metal bit line can be deposited over a column of memory cells, but first a metal silicon nitride layer can be deposited between the electrode layer and the metal bit line. In some cases, the metal silicon nitride layer can reduce resistivity between the top electrode layer and the metal bit line.

One process for manufacturing this type of phase change memory can include the following steps. First, continuous layers of phase change material and top electrode material can be deposited. Then these layers can be divided into individual memory cells separated by dielectric material. A layer of metal silicon nitride can then be deposited over the top of the top electrodes and the dielectric material. A metal bit line can be deposited over the metal silicon nitride layer. This results in a memory structure having a continuous layer of metal silicon nitride that extends along the top surfaces of the dielectric material and top electrodes of a column of memory cells.

It has been found that the process described above can create several disadvantages, both in the quality of the phase change memory array as a final product and in the ease of manufacturing the phase change memory array. Layers of the various materials can be deposited by methods such as chemical vapor deposition (CVD), physical vapor deposition (PVD) spin coating/spin-on deposition (SOD), electron beam evaporation, and others. In some cases the layers can be patterned using methods such as lithography techniques including wet etch, dry etch, and other patterning methods. In some cases, a temporary layer such as a mask or a protective cap can be deposited and then subsequently removed by a polishing operation, such as chemical mechanical polishing (CMP).

In the phase change memory manufacturing method described above, a vertical conductive via can be added after the memory cells are divided and separated by dielectric material. The conductive via can be formed from a metal such as tungsten. A temporary nitride layer can be deposited over the memory cells while forming the via. After the via is formed, the nitride layer can be removed by a chemical mechanical polishing operation. A metal silicon nitride layer can then be deposited over the top of the top electrodes of the memory cells and the dielectric material between the cells. The metal silicon nitride layer is also deposited over the via. A metal bit line can then be deposited over the metal silicon nitride layer.

One disadvantage of this process is related to performing a chemical mechanical polishing operation that stops at the top surface of the top electrodes of the memory cells. In some cases, the top electrodes are made of a relatively soft material, such as a carbon-based material. The chemical mechanical processing operation can wear away some of the top electrode material. In some cases, the top electrodes can wear away more at their center than at the edges, resulting in non-uniformity that can negatively affect subsequent processes such as subsequent etch operations. This non-uniformity can change etch profiles and cause, for example, under-etching, over-etching, or more lateral etch than desired. This can potentially expose the cell stack. These can negatively impact cell yield. In some cases, these issues can result in cross-contamination of select device materials and phase change materials.

The chemical mechanical processing operation can also cause "dishing," or in other words having a curved depression in the top surface of the dielectric material. This dishing can negatively affect the operation of the memory cell. In some cases, the memory cell can be inoperable, which negatively affects cell yield.

Additionally, the process described above results in a metal silicon nitride layer between the bit line and the via. In some cases the via and the bit line are made of the same metal, such as tungsten. Including a metal silicon nitride layer, such as tungsten silicon nitride, between the bit line and the via can increase electrical resistance between the bit line and the via compared to a direct metal-to-metal contact between the bit line and the via. However, it is often desirable to include the metal silicon nitride layer to connect the top electrodes to the bit line as mentioned above. The process also results in a via that protrudes above the top surface of the top electrodes. Thus, when the metal silicon nitride layer and the bit line are deposited, they must wrap around the protruding via. The deposition of the metal silicon nitride layer further adds to the via protrusion. In some cases the via protrudes to the point that the bit line deposited over the via can break in the vicinity of the via.

The present technology provides new processes for manufacturing phase change memory structures. These new processes can solve the problems described above. In one example, a similar phase change memory structure can be made with a column of memory cells electrically connected by a bit line and a vertical via also connected to the bit line. However, instead of depositing a metal silicon nitride layer after forming the memory cells and the via, a continuous metal silicon nitride layer can be deposited at the beginning of the process before the memory cells are divided. For example, a stack of layers of material can be deposited, including a continuous layer of phase change material and a continuous layer of top electrode material. A continuous layer of metal silicon nitride can be deposited over the top electrode material at this stage. Additionally, a partial metal layer can be deposited over the metal silicon nitride layer. This layer is referred to as a "partial" layer because additional metal can be deposited later to form a metal bit line. The partial layer can also be thinner than the full metal layer deposited to form the metal bit line.

After the continuous layers of phase change memory materials are deposited (including the metal silicon nitride layer and partial metal layer), the layers can be divided into individual memory cells and vias can be formed as described above. However, adding the metal silicon nitride layer and partial metal layer in the early stages of the process can produce several advantages. First, a temporary protective nitride layer can be deposited over the memory cells during formation of the vias as described above. The temporary nitride layer can be removed by chemical mechanical polishing. However, in the new process the chemical mechanical polishing operation can stop on the partial metal layer instead of on the top electrode layer. The partial metal layer can be harder than the top electrode layer and less prone to erosion caused by the chemical mechanical polishing operation. Thus, the partial metal layer can protect the top electrode layer so that the top electrode layer remains uniform.

Additionally, because the metal silicon nitride layer is deposited before the memory cells are divided into individual memory cells, the metal silicon nitride layer is discontinuous and does not cover the top of the via. When the metal bit line is deposited at the end of the process, the metal bit line directly contacts the via by a metal-to-metal contact. This can have reduced resistance compared to the previous process in which the metal silicon nitride layer is between the metal bit line and the via.

Further, the via does not protrude as far in the process according to the present technology. In the previous process, the via protrusion was greater because the temporary nitride layer was polished all the way down to the top electrode layer. But in the present process, a metal silicon nitride layer and a partial metal layer are present above the top electrode layer. The temporary nitride layer is polished only down to the partial metal layer. Thus, the polishing proceeds a shorter distance resulting in the via protruding a shorter distance when the metal bit line is deposited.

Making phase change memory structures using the new processes described herein results in phase change memory structures having a unique structure. First, the partial metal layer can be made of the same metal as the metal bit line that is deposited over the partial metal layer at the end of the process. Thus, the partial metal layer together with the metal deposited to form the bit line can be considered to be a bit line having a non-flat bottom surface that extends down to contact the metal silicon nitride layer of the memory cell. Thus, the bit line can have a different shape than the bit line formed using the previous process. Additionally, the metal silicon nitride layer can be discontinuous, as opposed to the continuous metal silicon nitride layer provided by the previous process. The metal silicon nitride layer also is not present between the dielectric material and the bit line or between the via and the bit line, unlike the metal silicon nitride layer provided by the previous process. The present process can also provide top electrode layers that have a more uniform upper surface. No erosion of the top electrode layers occurs because the chemical mechanical polishing process does not proceed down to the upper surface of the top electrode layers. Furthermore, the metal it line can bulge less over the via because the via protrudes less than in the previous process.

With this description in mind, FIG. 1 shows a cross-sectional view of an example phase change memory structure 100 according to the present technology. This structure includes a memory cell made up of a phase change material layer 110 and a top electrode layer 120 above the phase change material layer. A dielectric material 130 is adjacent to the memory cell. The memory cell can also include a metal silicon nitride layer 150 in contact with the top electrode layer. However, no metal silicon nitride layer is in contact with the top surface of the dielectric material. The dielectric material can have a top surface 135 that is higher than the top surface 125 of the memory cell. In some examples, the top surface of the memory cell can be the top surface of the top electrode layer or the top surface of the metal silicon nitride layer, if present. It should be noted that the top surface being higher than the top surface of the memory cell is different from the structure provided by the previous process, because in the previous process the top surface of the dielectric material is at the same height as the top surface of the top electrode of the memory cell. FIG. 1 also shows a bit line 140 having a non-flat bottom surface that contacts the top surface of the dielectric material and protrudes down from the top surface of the dielectric material to the top surface of the memory cell.

In some examples, the metal used in the bit line and the metal silicon nitride layer can be the same type of metal. In other examples, different metals can be used in the different layers. In one particular example, tungsten can be the metal in each of these layers. Thus, the metal silicon nitride layer can include tungsten silicon nitride (WSiN) and the bit line can be made of tungsten (W). A variety of other metals can also be used in the phase change memory structure. In certain specific examples, the metal can be tungsten, tantalum, niobium, molybdenum, titanium, or a combination thereof. In further examples, the metal in each layer can consist of one of these metals.

In other specific examples, the metal silicon nitride layer can include or consist of tungsten silicon nitride, tantalum silicon nitride, niobium silicon nitride, molybdenum silicon nitride, titanium silicon nitride, or a combination thereof.

In still further specific examples, the bit line can include or consist of tungsten, tantalum, niobium, molybdenum, titanium, or a combination thereof.

As used herein, "metal silicon nitride" describes materials formed of a metal, silicon, and nitride. This term does not limit the material to any specific stoichiometric proportions of metal, silicon, and nitrogen atoms in the material. Acronyms used to describe specific materials herein, such as "WSiN," are not intended to limit the material to any particular stoichiometric ratios of the atoms in the material.

The thicknesses of the layers are not particularly limited. However, in some examples the metal silicon nitride layer can have a thickness of 10 Å to 300 Å. In further examples, the metal silicon nitride layer can have a thickness of 20 Å to 100 Å. In a particular example, the metal silicon nitride layer can be about 50 Å thick. In other examples, the top electrode layer can have a thickness of 10 Å to 500 Å. In further examples, the top electrode layer can have a thickness of 20 Å to 200 Å. In additional examples, the partial metal layer can have a thickness of 20 Å to 500 Å. In certain examples, the partial metal layer can have a thickness of 50 Å to 300 Å. In a particular example, the partial metal layer can have a thickness of about 250 Å. In still further examples, the conductive metal bit line can have a thickness of 100 Å to 1000 Å. It should be noted that the layer thicknesses, lengths, and widths shown in the figures are not necessarily drawn to scale.

In some examples, the top electrode can have a top surface that is substantially flat. This is an improvement over the previous process, which can result in erosion of the top electrodes. In some examples, the substantially flat top electrode can have a height variation of 10 Å or less, 5 Å or less, or even 2 Å or less.

In certain examples, the phase change memory structures described herein can include additional layers not shown in FIG. 1. These additional layers can include, but are not limited to, additional electrode layers, diffusion barrier layers, select device material layers, conductive word line layers, and so on.

As a general matter, the phase change material can include any useful material having a stable and detectable change in phase. Examples of such a materials include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., $Ge_xSb_yTe_z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient.

It is noted that the select device material is generally made of a phase change material, and as such, the above exemplary chalcogenide materials are applicable as well. The actual chalcogenide material used in a given memory structure for the phase change material layer and the select device material layer can be different or the same, depending on the design of the device. In another example, the select device material can be a conductor, semiconductor, or dielectric material. Such materials can be selected as needed to perform an intended function in the phase change memory structure.

The top electrode layer and/or other electrode layers in the phase change memory structure can be formed of conductive materials. In some examples, the electrode layers can include carbon-containing materials. Specific, non-limiting examples of electrode materials can include amorphous carbon, amorphous carbon doped with silicon, and silicon carbide doped with tungsten.

In some examples, the dielectric material can be a spin-on dielectric material. In a particular example, the dielectric material can be a silicon dioxide dielectric material.

Figure 2:
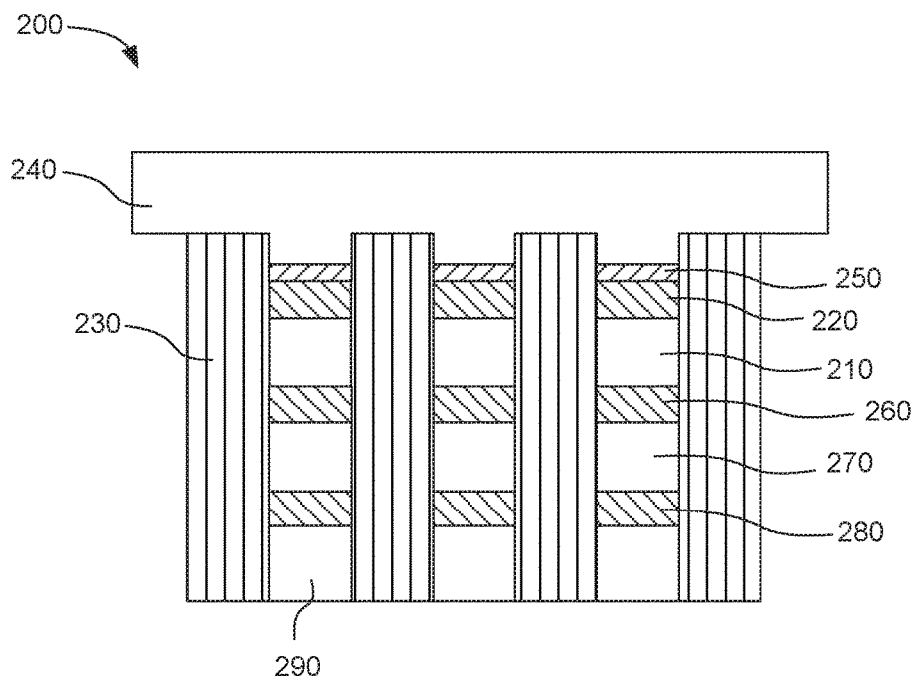
FIG. 2 is a cross-sectional view of an example phase change memory structure in accordance with an example embodiment.

FIG. 2 shows a cross-sectional view of another example phase change memory structure 200. The phase change memory structure includes a plurality of memory cells comprising a phase change material layer 210 and a top electrode layer 220 above the phase change material layer. A dielectric material 230 is located between the memory cells to electrically insulate the memory cells one from another. A metal silicon nitride layer 250 is deposited on a top surface of the top electrode layers. No metal silicon nitride layer is on a top surface of the dielectric material. A bit line 240 has a bottom surface that contacts the top surface of the dielectric material and the metal silicon layer.

The example shown in FIG. 2 also includes additional layers in the memory cells. A middle electrode layer 260 is located below the phase change material layer. A select device material layer 270 and a bottom electrode layer 280 are located below the middle electrode. A word line 290 is in contact with the bottom surface of the bottom electrode layer.

It should be noted that the figures described herein show examples of memory structures and arrays to illustrate features of the present technology, and that the present technology is not limited by the number of memory cells, size of arrays, dimensions of material layers, etc., as shown in the figures. In many practical applications, phase change memory structures and systems in accordance with the present technology can have many more memory cells than are depicted in the figures. For example, phase change memory structures and systems can have millions, billions, or more memory cells compared to the relatively small number depicted in the figures.

In some examples, bit lines can be oriented along columns of memory cells and word lines can be oriented along rows of memory cells. In many embodiments described herein, the bit lines are described as being deposited on the top of the memory cells while the word lines are described as being at the bottom of the memory cells. However, in other embodiments, the word lines can be at the top of the memory cells and the bit lines can be at the bottom of the memory cells. Additionally, because designation of "rows" and "columns" of memory cells can be arbitrary, in many cases the terms "bit line" and "word line" can be interchangeable and merely describe which electrically conductive line is oriented in the row direction and which is oriented in the column direction. Thus, embodiments that are described as having bit lines on top of the memory cells can also encompass devices having word lines on the top. Similarly, embodiments described as having word lines on the bottom of the memory cells can also encompass devices having bit lines on the bottom.

Figure 3:
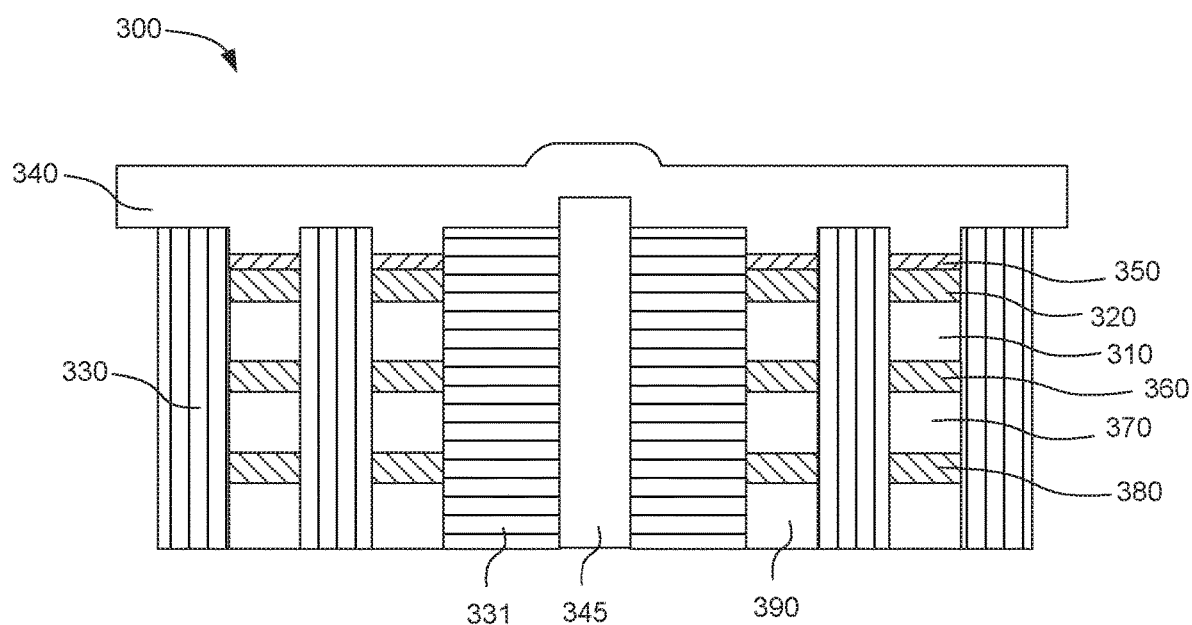
FIG. 3 is a cross-sectional view of an example phase change memory structure in accordance with an example embodiment.

FIG. 3 shows a cross-sectional view of another example phase change memory structure 300. The phase change memory structure includes a plurality of memory cells that each includes a phase change material layer 310 and a top electrode layer 320 above the phase change material layer. A metal silicon nitride layer 350 is deposited on a top surface of the top electrode layers. A vertical via 345 is separated from the plurality of memory cells by a dielectric material 331. The vertical via can be formed of metal. A bit line 340 can be formed of the same metal, and have a bottom surface that contacts the metal silicon nitride layer and a top surface of the vertical via. No metal silicon nitride layer is deposited on the top surface of the vertical via such that the bit line contacts the top surface of the vertical via by a metal-to-metal contact.

The memory cells are also separated one from another by a second dielectric material 330. In some examples, the dielectric material 331 and the second dielectric material can be different materials. In a particular example, the dielectric material can be tetraethyl orthosilicate and the second dielectric material can be a carbon spin on dielectric. In some cases, some dishing of the tetraethyl orthosilicate can occur during a chemical mechanical polishing operation. However, the presently disclosed process requires polishing a shorter distance than the previous process, and therefore the dishing of the tetraethyl orthosilicate can be less than in the previous process. In some examples, the tetraethyl orthosilicate can have a height variation of less than 150 Å.

In further examples, the tetraethyl orthosilicate can have a height variation of less than 50 Å.

As shown in FIG. 3, the bit line can bulge upward in the location where the bit line wraps around the top surface of the vertical via. As mentioned above, the vertical via can protrude a shorter distance compared to the previous process. This can result in a reduced amount of bulging of the bit line over the via. In some examples, the bit line can bulge upward by 50 Å to 300 Å where the bit line wraps around the top surface of the vertical via.

The contact between the bit line and the vertical via can also have reduced resistance compared to the previous process, because no metal silicon nitride layer is present between the bit line and the via. If the bit line and the via are made of the same metal, then the bit line and via can become a single unitary body of the metal with low resistance.

The example shown in FIG. 3 also includes additional layers in the memory cells. A middle electrode layer 360 is located below the phase change material layer. A select device material layer 370 and a bottom electrode layer 380 are located below the middle electrode. A word line 390 is in contact with the bottom surface of the bottom electrode layer.

Figure 4:
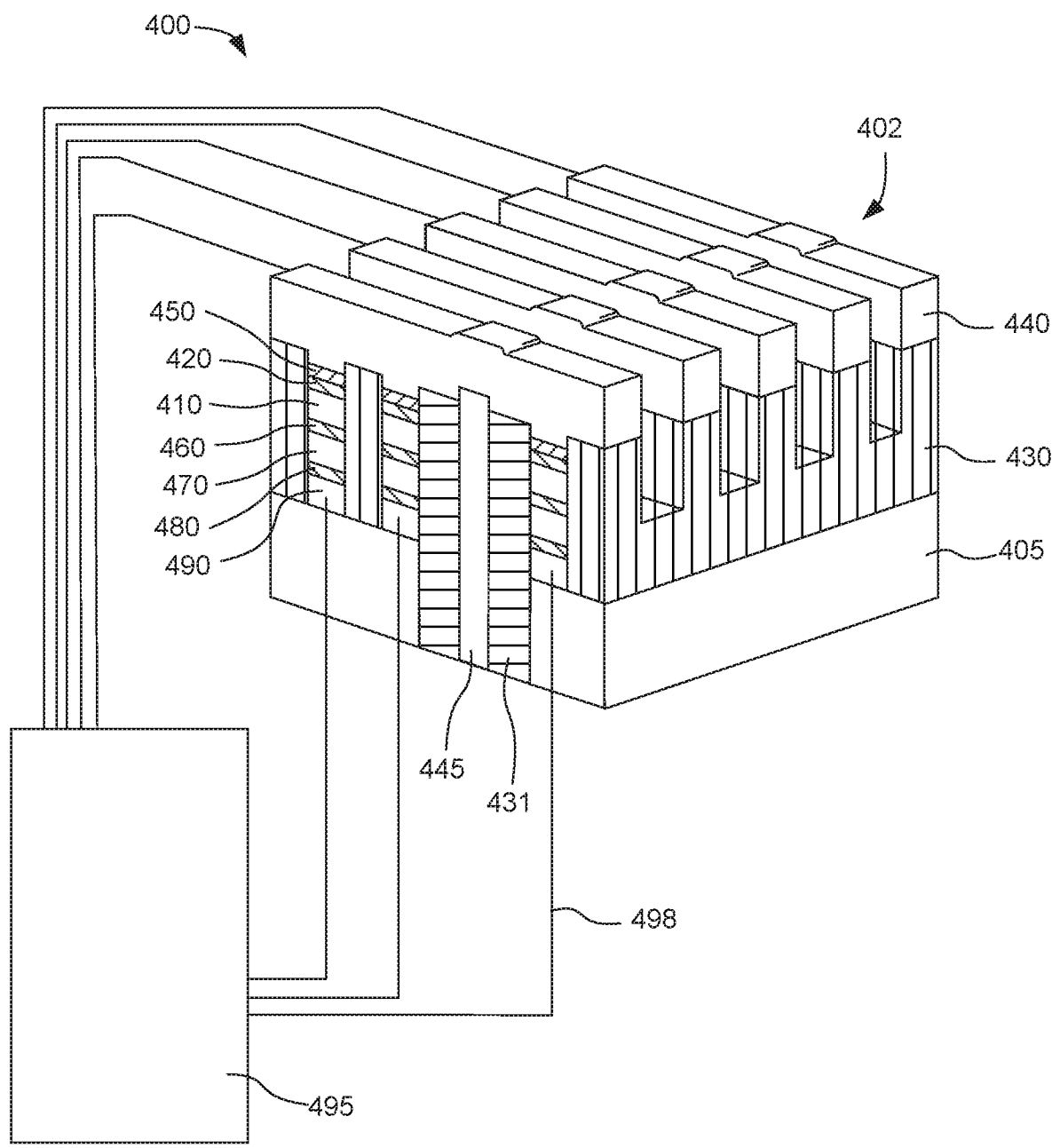
FIG. 4 is a schematic of an example phase change memory system in accordance with an example embodiment.

FIG. 4 shows a schematic of an example phase change memory system 400. The system includes an array 402 of memory cells arranged in rows and columns on a substrate 405. The memory cells include a phase change material layer 410, a top electrode layer 420 above the phase change material layer, and a metal silicon nitride layer 450 above the top electrode layer. A dielectric material 430 is between the memory cells to electrically insulate the memory cells one from another. The dielectric material can have a top surface that is higher than a top surface of the memory cell. A plurality of bit lines 440 are oriented along the columns of memory cells. The bit lines have non-flat bottom surfaces that contact the top surface of the dielectric material and protrude down from the top surface of the dielectric material to a top surface of the memory cell. The memory cells also include a middle electrode layer 460, a select device material layer 470, and a bottom electrode layer 480. A plurality of word lines 490 run along rows of memory cells. The word lines are in contact with the bottom surfaces of the memory cells. The array also includes a vertical via 445 separated from the memory cells by a second dielectric material 431.

In addition to the array 402 of memory cells, the system 400 also includes a read/write controller 495. The read/write controller is electrically coupled to the plurality of word lines and the plurality of bit lines through electrical connections 498. The read/write controller can be operable to perform read and write operations to and from the array of memory cells via the plurality of word lines and the plurality of bit lines.

In various examples, the system can also include any number of user interfaces, display devices, as well as various other components that would be beneficial for such a system.

In further examples, the system can also include additional memory that can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The system can additionally include a local communication interface for connectivity between the various components of the system.

Further, the system can include an input/output (I/O) interface for controlling the I/O functions of the system, as well as for I/O connectivity to devices outside of the system. A network interface can also be included for network connectivity, either as a separate interface or as part of the I/O interface. The network interface can control network communications both within the system and outside of the system. The network interface can include a wired interface, a wireless interface, a Bluetooth interface, optical interface, and the like, including appropriate combinations thereof.

Phase change memory structures and systems as described herein can be incorporated into a wide variety of devices. While any type or configuration of device or computing system is contemplated to be within the present scope, non-limiting examples can include laptop computers, tablet computers, smart phones, CPU systems, SoC systems, server systems, networking systems, storage systems, high capacity memory systems, or any other computational system.

Figure 5:
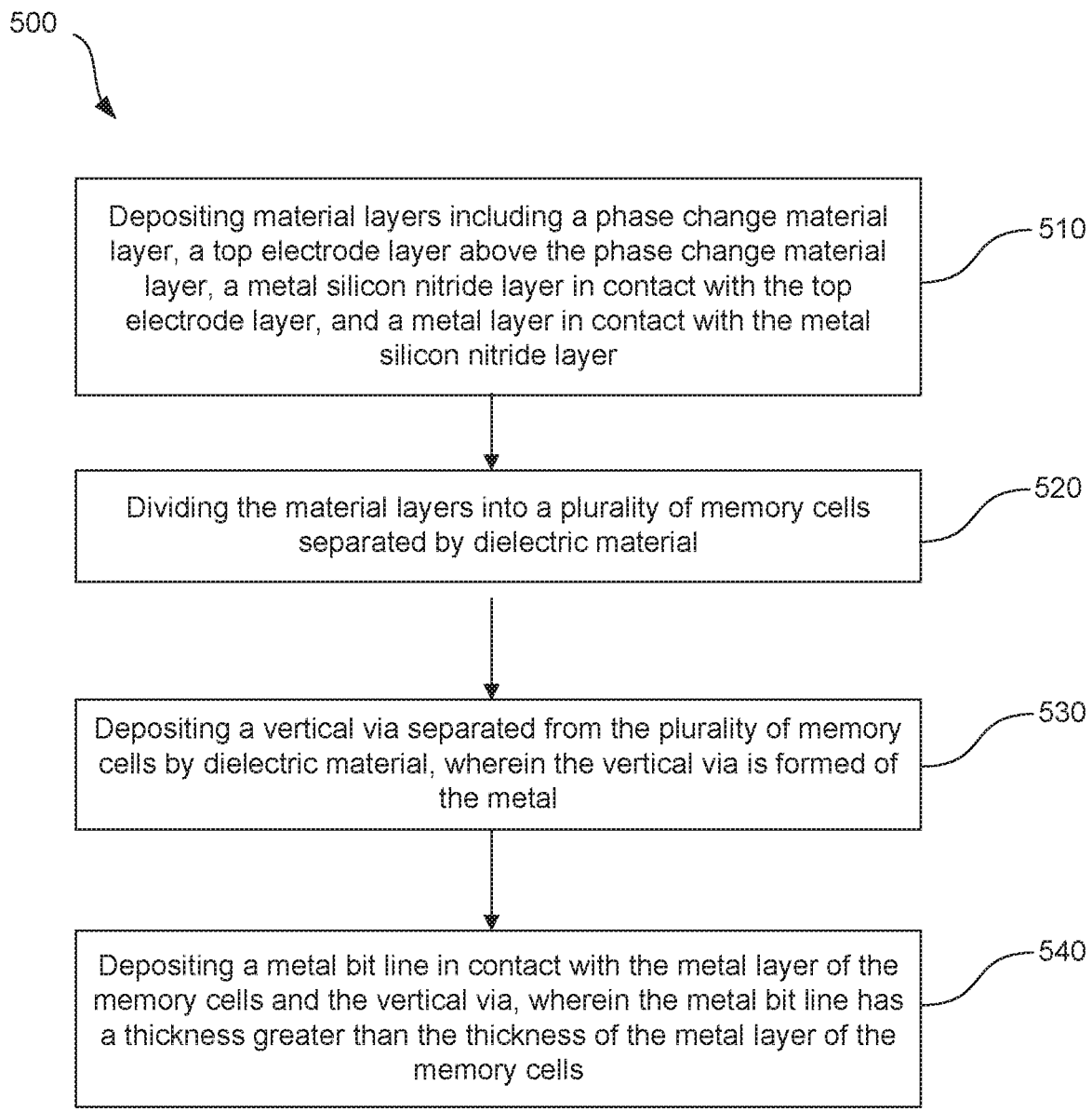
FIG. 5 is a flowchart of an example method of making a phase change memory structure in accordance with an example embodiment.

The present technology also extends to methods of making phase change memory structures. FIG. 5 is a flow chart of an example method 500 of making a phase change memory structure. The method includes: depositing material layers including a phase change material layer, a top electrode layer above the phase change material layer, a metal silicon nitride layer in contact with the top electrode layer, and a metal layer in contact with the metal silicon nitride layer 510; dividing the material layers into a plurality of memory cells separated by dielectric material 520; depositing a vertical via separated from the plurality of memory cells by dielectric material, wherein the vertical via is formed of the metal 530; and depositing a metal bit line in contact with the metal layer of the memory cells and the vertical via, wherein the metal bit line has a thickness greater than the thickness of the metal layer of the memory cells 540.

In some examples, a nitride layer can be deposited over the metal layer before dividing the material layers into the plurality of memory cells. In further examples, a nitride cap layer can be deposited over the nitride layer of the memory cells and over the dielectric material after dividing the material layers into the plurality of memory cells. In a particular example, tetraethyl orthosilicate can be deposited adjacent to the plurality of memory cells. The vertical via can be deposited through the tetraethyl orthosilicate so that the tetraethyl orthosilicate separates the vertical via from the plurality of memory cells. As mentioned above, the method can also include removing the nitride layer over the memory cells and a portion of the dielectric material using a polishing operation adapted to stop on the metal layer of the memory cells.

EXAMPLES

The following examples pertain to specific embodiments and point out specific features, elements, or steps that can be used or otherwise combined in achieving such embodiments.

Figure 6A:
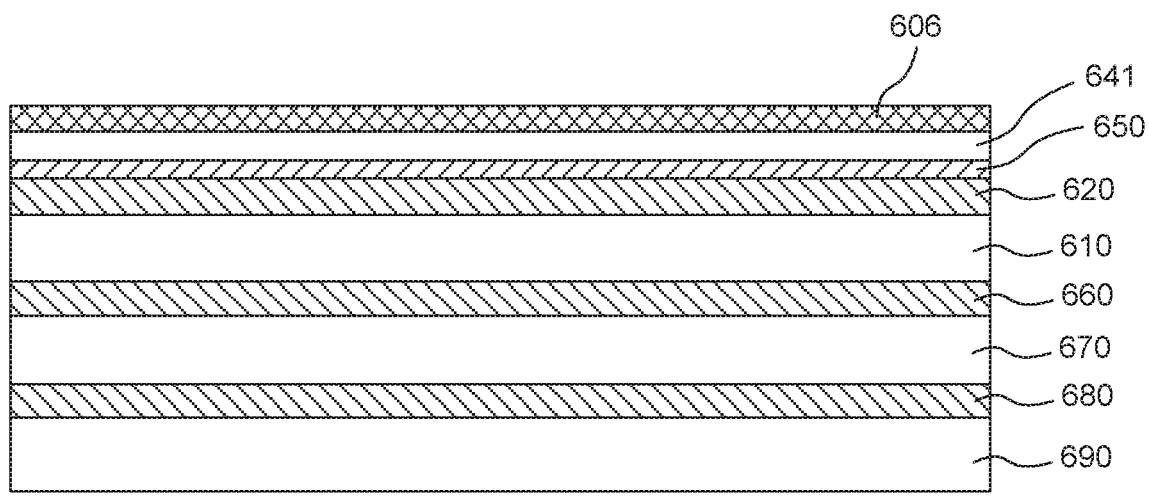
FIGS. 6A-6I are cross-sectional views of steps in a method of making a phase change memory structure in accordance with an example embodiment.

FIGS. 6A through 6I show cross-sectional views of multiple steps in a method of making a phase change memory structure in accordance with the present technology. In FIG. 6A, continuous layers of several materials are deposited. From bottom to top, the layers include: a tungsten word line 690, a bottom electrode layer 680, a select device material layer 670, a middle electrode layer 660, a phase change material layer 610, a top electrode material layer 620, a tungsten silicon nitride layer 650, a partial tungsten layer 641, and a temporary nitride layer 606. The electrode layers are carbon-containing electrode materials.

Figure 6B:
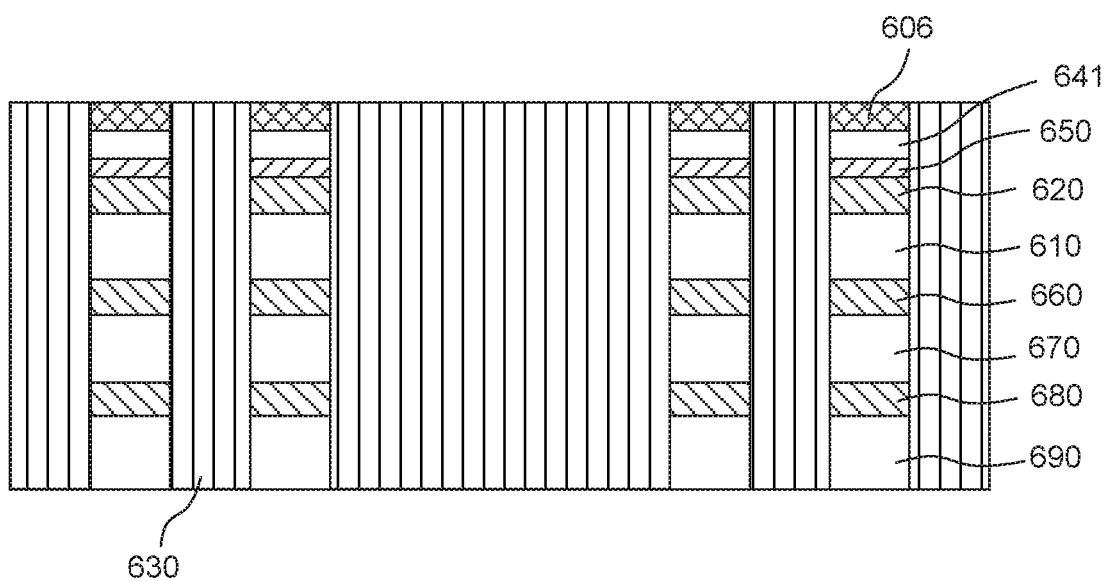

In FIG. 6B, the layers have been etched to divide the layers into individual memory cells. A spin-on dielectric 630 is deposited between the memory cells.

Figure 6C:
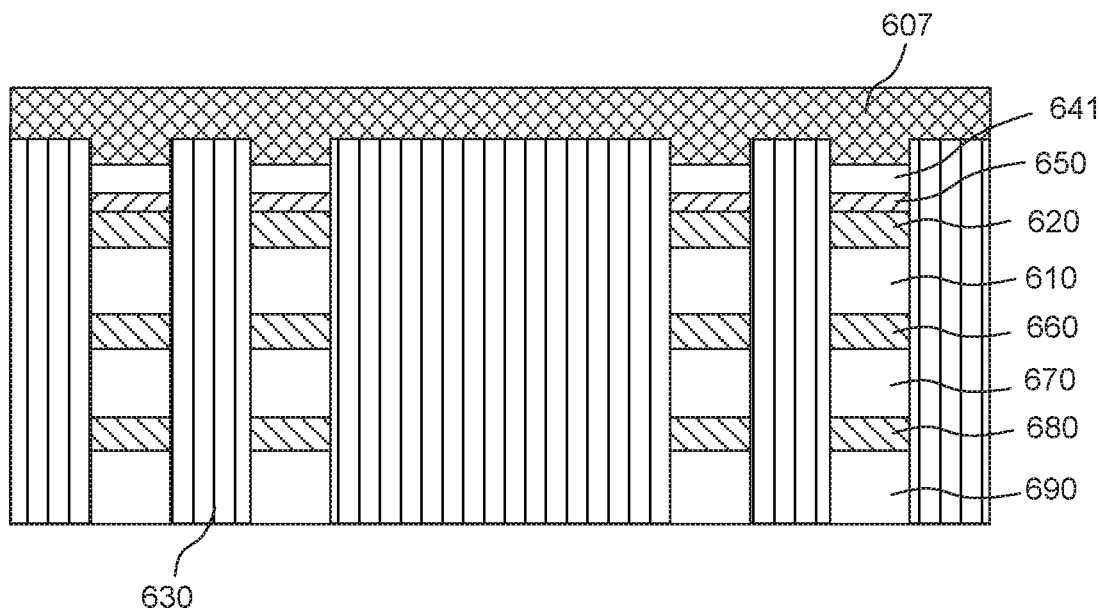

In FIG. 6C, a nitride cap 607 is added to the nitride layer on the top of the structure.

Figure 6D:
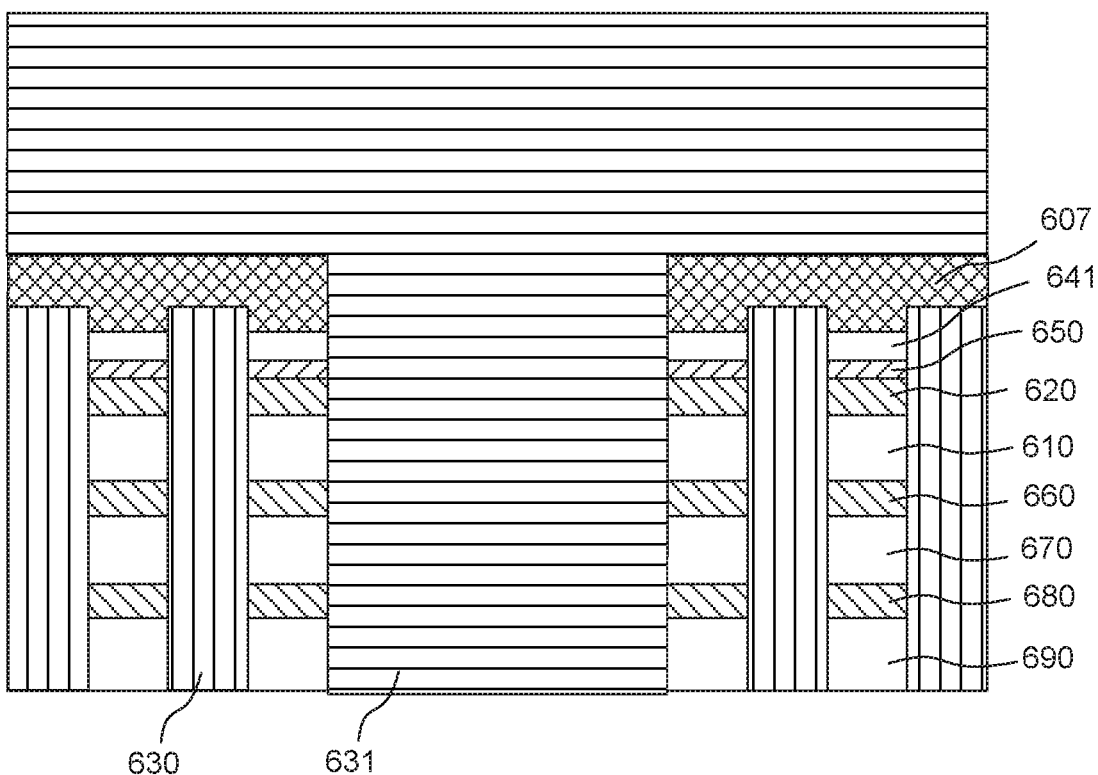

In FIG. 6D, the spin-on dielectric material in the central portion is etched away and the space is filled with tetraethyl orthosilicate 631.

Figure 6E:
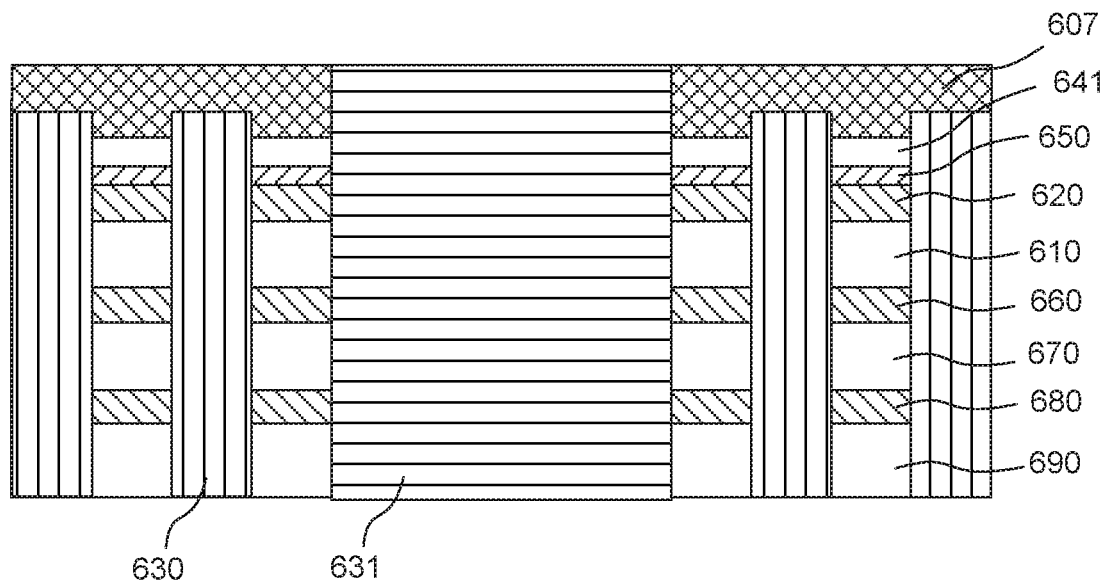

In FIG. 6E, the top portion of the tetraethyl orthosilicate is polished away by a chemical mechanical polishing operation designed to stop on the nitride cap.

Figure 6F:
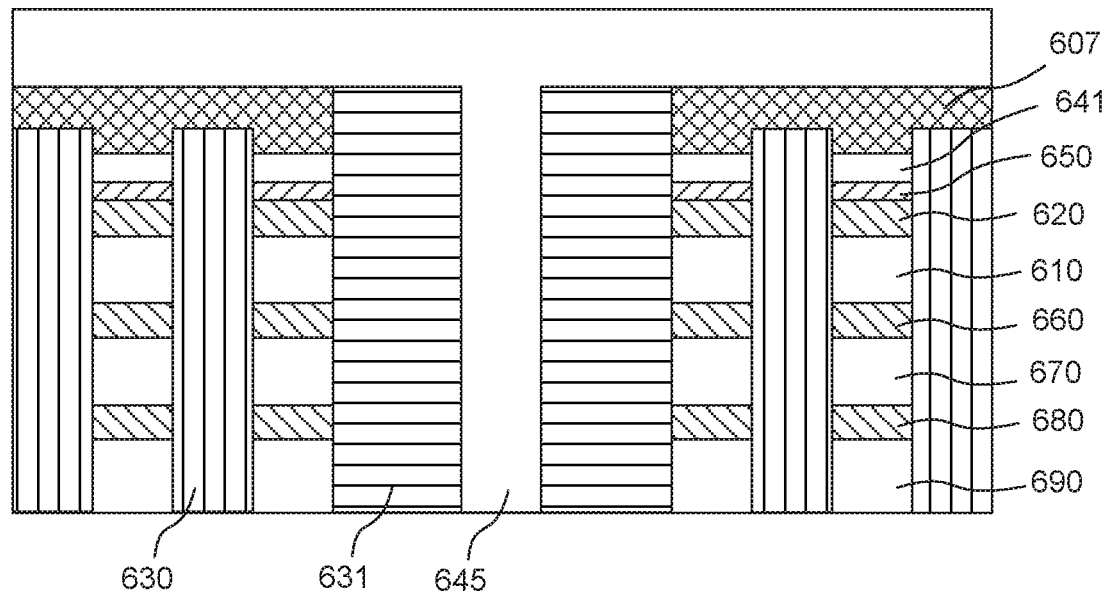

In FIG. 6F, a via 645 is formed by etching a space for the via in the tetraethyl orthosilicate and depositing tungsten.

Figure 6G:
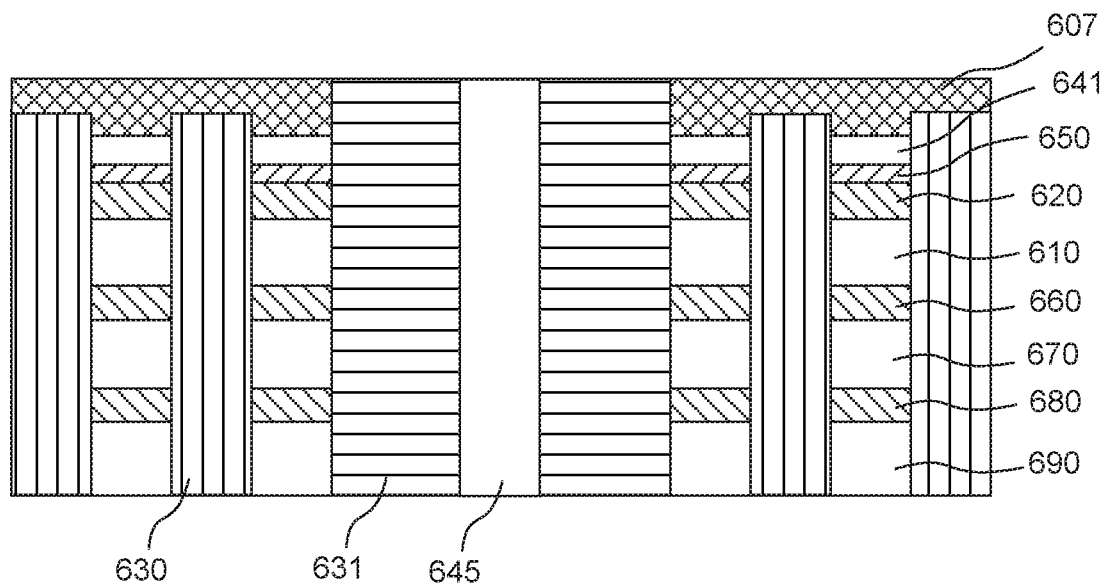

In FIG. 6G, the top portion of the tungsten is polished away by a chemical mechanical polishing operation designed to stop on the nitride cap.

Figure 6H:
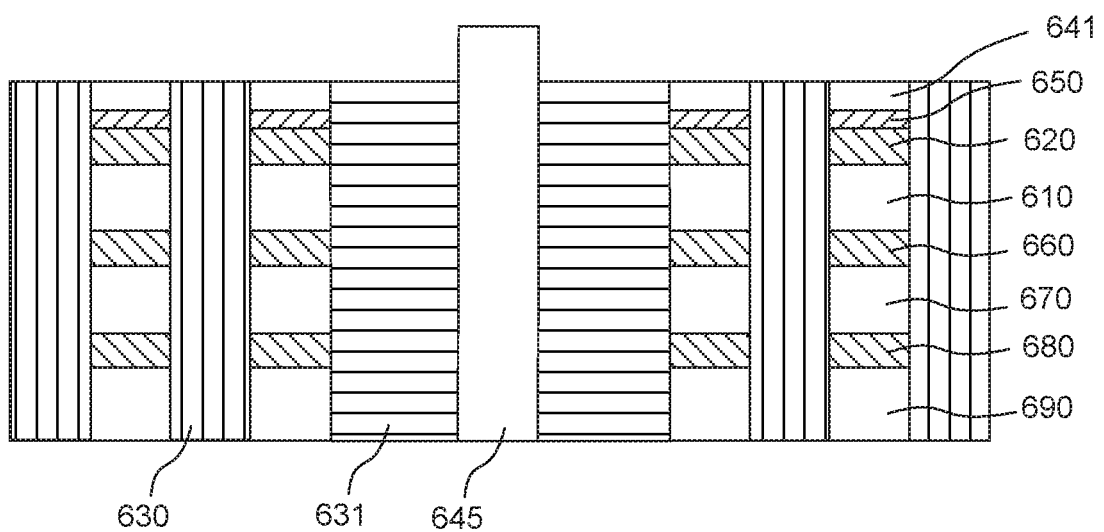

In FIG. 6H, the nitride cap is removed by a chemical mechanical polishing operation designed to stop on the tungsten layers at the tops of the memory cells.

Figure 6I:
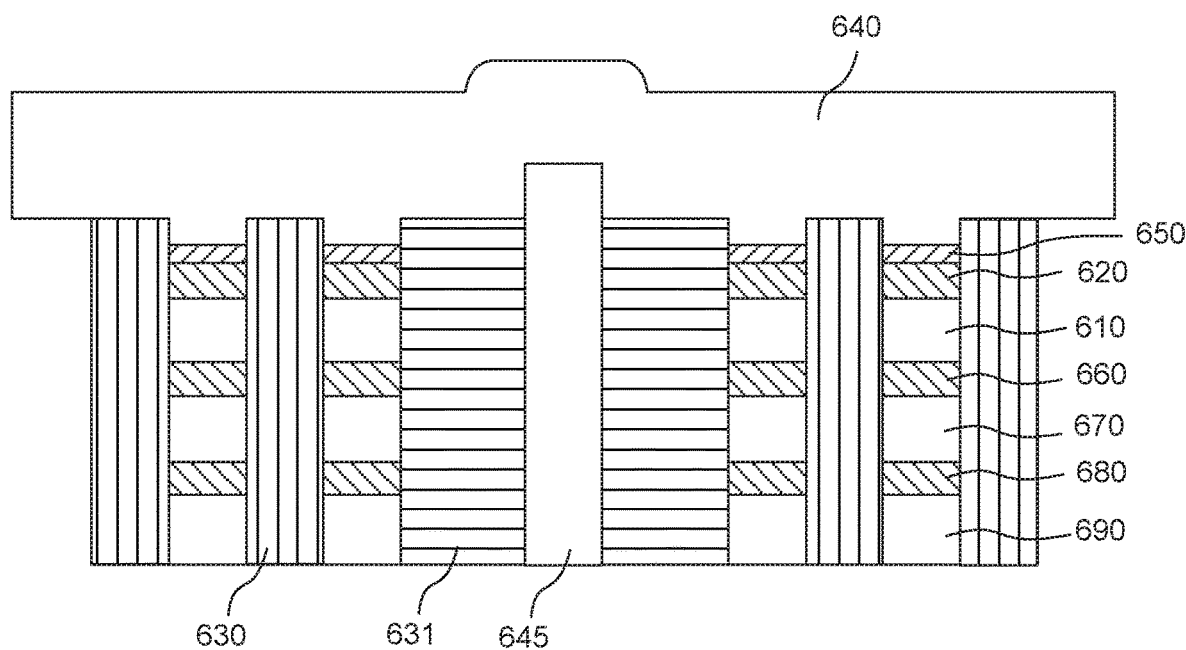

In FIG. 6I, additional tungsten is deposited to form a tungsten bit line 640. As described above, the additional tungsten together with the partial tungsten layers that were deposited earlier form a bit line with a non-flat bottom surface that protrudes down from the top surfaces of the spin-on dielectric material to the top surface of the tungsten silicon nitride layers.

In another exemplary embodiment of the present technology, a phase change memory structure is provided. The phase change memory structure includes a memory cell, a dielectric material adjacent to the memory cell, and a bit line. The memory cell includes a phase change material layer and a top electrode layer above the phase change material layer. The dielectric material has a top surface that is higher than a top surface of the top electrode layer. The bit line has a non-flat bottom surface that contacts the top surface of the dielectric material and protrudes down from the top surface of the dielectric material to a top surface of memory cell.

In some examples, the bit line includes tungsten, tantalum, niobium, molybdenum, titanium, or a combination thereof.

In a further example, the memory cell also includes a metal silicon nitride layer in contact with the top electrode layer, where no metal silicon nitride layer is in contact with the top surface of the dielectric material.

In yet another example, the metal silicon nitride layer includes tungsten silicon nitride, tantalum silicon nitride, niobium silicon nitride, molybdenum silicon nitride, titanium silicon nitride, or a combination thereof.

In an additional example, the metal silicon nitride layer has a thickness from 10 Å to 300 Å.

In a further example, the memory cell also includes a middle electrode layer below the phase change material layer, a select device layer below the middle electrode layer, a bottom electrode layer below the select device layer, and a word line layer below the bottom electrode layer.

In a still further example, the height distance between the top surface of the dielectric material and the top surface of the top electrode layer is from 20 Å to 500 Å.

In another example, the dielectric material is a spin on dielectric.

In yet another example, the top electrode layer comprises a carbon-containing material.

In a further example, the top surface of the top electrode is substantially flat.

In one example, the phase change material layer comprises a chalcogenide.

In a further example, the phase change memory structure includes a vertical via separated from the memory cell by a second dielectric material. The vertical via is formed of a metal, and the bit line is formed of the metal. The bottom surface of the bit line connects to a top surface of the vertical via. No metal silicon nitride layer is deposited on the top surface of the vertical via such that the bit line contacts the top surface of the vertical via by a metal-to-metal contact.

In some such examples, the metal is tungsten, tantalum, niobium, molybdenum, titanium, or a combination thereof.

In another example, the dielectric material and the second dielectric material are different materials. In a particular example, the dielectric material is a carbon spin on dielectric and the second dielectric material is tetraethyl orthosilicate. In another particular example, the tetraethyl orthosilicate has a height variation of less than 150 Å.

In a still further example, the bit line bulges upward by 50 Å to 300 Å where the bit line wraps around the top surface of the vertical via.

Another exemplary embodiment of the present technology includes another phase change memory structure. The phase memory structure includes a plurality of memory cells, a dielectric material between the memory cells to electrically insulate the memory cells one from another, a metal silicon nitride layer, and a bit line. The memory cells include a phase change material layer and a top electrode layer above the phase change material layer. The metal silicon nitride layer is deposited on the top surface of the top electrode layers, and no metal silicon nitride layer is deposited on the top surface of the dielectric material. The bit line has a bottom surface that contacts the top surface of the dielectric material and the metal silicon nitride layer.

In some examples, the bit line comprises tungsten, tantalum, niobium, molybdenum, titanium, or a combination thereof.

In further examples, the metal silicon nitride layer comprises tungsten silicon nitride, tantalum silicon nitride, niobium silicon nitride, molybdenum silicon nitride, titanium silicon nitride, or a combination thereof.

In one example, the top surface of the dielectric material is higher than the metal silicon nitride layer and the bottom surface of the bit line is non-flat such that the bottom surface contacts the top surface of the dielectric material and protrudes down from the top surface of the dielectric material to the metal silicon nitride layer.

In another example, the metal silicon nitride layer has a thickness from 10 Å to 300 Å.

In a further example, the memory cells includes a middle electrode layer below the phase change material layer, a select device layer below the middle electrode layer, a bottom electrode layer below the select device layer, and a word line layer below the bottom electrode layer.

In a still further example, the height distance between the top surface of the dielectric material and the top surface of the top electrode layer is from 20 Å to 500 Å.

In a particular example, the dielectric material is a spin on dielectric.

In another particular example, the top electrode layer includes a carbon-containing material.

In a further example, the top surface of the top electrode is substantially flat.

In another example, the phase change material layer comprises a chalcogenide.

In another exemplary embodiment of the present technology, a phase change memory structure is provided. The phase change memory structure includes: a plurality of memory cells that each include a phase change material layer and a top electrode layer above the phase change material layer; a metal silicon nitride layer deposited on a top surface of the top electrode layers; a vertical via separated from the plurality of memory cells by a dielectric material, where the vertical via is formed of a metal; and a bit line formed of the metal having a bottom surface that contacts the metal silicon nitride layer and a top surface of the vertical via, wherein no metal silicon nitride layer is deposited on the top surface of the vertical via such that the bit line contacts the top surface of the vertical via by a metal-to-metal contact.

In one example, the metal of the vertical via and bit line is tungsten, tantalum, niobium, molybdenum, titanium, or a combination thereof.

In another example, the metal silicon nitride layer includes tungsten silicon nitride, tantalum silicon nitride, niobium silicon nitride, molybdenum silicon nitride, titanium silicon nitride, or a combination thereof.

In a further example, the phase change memory structure includes a second dielectric material between the memory cells to electrically insulate the memory cells one from another.

In a still further example, the dielectric material and the second dielectric material are different materials. In a particular example, the dielectric material is tetraethyl orthosilicate and the second dielectric material is a carbon spin on dielectric. In another particular example, the tetraethyl orthosilicate has a height variation of less than 150 Å.

In another example, the bit line bulges upward by 50 Å to 300 Å where the bit line wraps around the top surface of the vertical via.

In an additional example, the metal silicon nitride layer has a thickness from 10 Å to 300 Å.

In further examples, the memory cells include a middle electrode layer below the phase change material layer, a select device layer below the middle electrode layer, a bottom electrode layer below the select device layer, and a word line layer below the bottom electrode layer.

In another example, the top electrode layer comprises a carbon-containing material.

In yet another example, the top surface of the top electrode is substantially flat.

In an additional example, the phase change material layer comprises a chalcogenide.

Another exemplary embodiment of the present technology includes a phase change memory system. The system includes an array of memory cells arranged in rows and columns. The memory cells include a phase change material layer and a top electrode layer above the phase change material layer. The system also includes a dielectric material between the memory cells to electrically insulate the memory cells one from another. The dielectric material has a top surface that is higher than a top surface of the top electrode layers. A plurality of bit lines are oriented along the columns. The bit lines have a non-flat bottom surface that contacts the top surface of the dielectric material and protrudes down from the top surface of the dielectric material to a top surface of the memory cells. The system also includes a plurality of word lines oriented along the rows, where the word lines are in contact with a bottom surface of the memory cells. A read/write controller is electrically coupled to the plurality of word lines and the plurality of bit lines. The read/write controller is operable to perform read and write operations to and from the array of memory cells via the plurality of word lines and the plurality of bit lines.

In one example, the bit line includes tungsten, tantalum, niobium, molybdenum, titanium, or a combination thereof.

In another example, the memory cells also include a metal silicon nitride layer in contact with the top electrode layer, where no metal silicon nitride layer is in contact with the top surface of the dielectric material.

In a further example, the metal silicon nitride layer includes tungsten silicon nitride, tantalum silicon nitride, niobium silicon nitride, molybdenum silicon nitride, titanium silicon nitride, or a combination thereof.

In a particular example, the metal silicon nitride layer has a thickness from 10 Å to 300 Å.

In another example, the memory cell also includes a middle electrode layer below the phase change material layer, a select device layer below the middle electrode layer, and a bottom electrode layer below the select device layer, where the word lines are in contact with a bottom surface of the bottom electrode layer.

In a further example, the height distance between the top surface of the dielectric material and the top surface of the top electrode layer is from 20 Å to 500 Å.

In yet another example, the dielectric material is a spin on dielectric.

In another example, the top electrode layer includes a carbon-containing material.

In one example, the top surface of the top electrode is substantially flat.

In a further example, the phase change material layer includes a chalcogenide.

In a still further example, the system includes a vertical via separated from the memory cells by a second dielectric material, where the vertical via is formed of a metal, where the bit line is formed of the metal, and where the bottom surface of the bit line connects to a top surface of the vertical via. No silicon nitride layer is deposited on the top surface of the vertical via such that the bit line contacts the top surface of the vertical via by a metal-to-metal contact.

In yet another example, the dielectric material and the second dielectric material are different materials. In a particular example, the dielectric material is a carbon spin on dielectric and the second dielectric material is tetraethyl orthosilicate. In another particular example, the tetraethyl orthosilicate has a height variation of less than 150 Å.

In another example, the bit line bulges upward by 50 Å to 300 Å where the bit line wraps around the top surface of the vertical via.

Another exemplary embodiment of the present technology includes a method of making a phase change memory structure. The method includes: depositing material layers including a phase change material layer, a top electrode layer above the phase change material layer, a metal silicon nitride layer in contact with the top electrode layer, and a metal layer in contact with the metal silicon nitride layer; dividing the material layers into a plurality of memory cells separated by dielectric material; depositing a vertical via separated from the plurality of memory cells by dielectric material, where the vertical via is formed of the metal; and depositing a metal bit line in contact with the metal layer of the memory cells and the vertical via, where the metal bit line has a thickness greater than the thickness of the metal layer of the memory cells.

In one example, the metal bit line includes tungsten, tantalum, niobium, molybdenum, titanium, or a combination thereof.

In another example, the metal silicon nitride layer includes tungsten silicon nitride, tantalum silicon nitride, niobium silicon nitride, molybdenum silicon nitride, titanium silicon nitride, or a combination thereof.

In a further example, the metal silicon nitride layer has a thickness from 10 Å to 300 Å.

In a still further example, the metal layer has a thickness from 20 Å to 500 Å.

In one example, the material layers also include a middle electrode layer below the phase change material layer, a select device layer below the middle electrode layer, a bottom electrode layer below the select device layer, and a word line layer below the bottom electrode layer.

In a particular example, the memory cells are separated by a spin on dielectric.

In another example, a nitride layer is deposited over the metal layer before dividing the material layers into the plurality of memory cells.

In a further example, a nitride cap layer is deposited over the nitride layer of the memory cells and over the dielectric material after dividing the material layers into the plurality of memory cells.

In a still further example, tetraethyl orthosilicate is deposited adjacent to the plurality of memory cells, where the vertical via is deposited through the tetraethyl orthosilicate such that the tetraethyl orthosilicate is the dielectric material separating the vertical via from the plurality of memory cells.

In another example, the method includes removing the nitride layer over the memory cells and a portion of the dielectric material using a polishing operation adapted to stop on the metal layer of the memory cells.

While the forgoing examples are illustrative of the principles of embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A phase change memory structure, comprising:
    a memory cell comprising a phase change material layer, a top electrode layer above the phase change material layer, and a middle electrode layer below the phase change material layer;
    a first dielectric material adjacent to the memory cell and extending in a vertical direction along a side of the memory cell from the middle electrode layer to the top electrode layer, the first dielectric material having a top surface that is higher than a top surface of the top electrode layer;
    a via formed of a metal and extending in the vertical direction;
    a second dielectric material extending in the vertical direction adjacent a side of the via;
    a metal silicon nitride layer extending horizontally above the top electrode layer and in contact therewith, the first dielectric material, the second dielectric material and the via extending above a top surface of the metal silicon nitride layer; and
    a bit line having a non-flat bottom surface that contacts the top surface of the first dielectric material, a top surface of the second dielectric material, and a top surface of the via, and that further protrudes down from the top surface of the first dielectric material, the top surface of the second dielectric material, and the top surface of the via to the top surface of the metal silicon nitride layer.

2. The phase change memory structure of claim 1, wherein the memory cell further comprises a select device layer below the middle electrode layer, a bottom electrode layer below the select device layer, and a word line layer below the bottom electrode layer.

3. The phase change memory structure of claim 1, wherein a height distance between the top surface of the first dielectric material and the top surface of the top electrode layer is from 20 Å to 500 Å.

4. The phase change memory structure of claim 1, wherein the first dielectric material is a spin on dielectric.

5. The phase change memory structure of claim 1, wherein the phase change material layer comprises a chalcogenide.

6. The phase change memory structure of claim 1, wherein the top electrode layer comprises a carbon-containing material.

7. The phase change memory structure of claim 6, wherein the top surface of the top electrode is substantially flat.

8. The phase change memory structure of claim 1, wherein the bit line comprises tungsten, tantalum, niobium, molybdenum, titanium, or a combination thereof.

9. The phase change memory structure of claim 8, wherein no metal silicon nitride layer is in contact with the top surface of the first dielectric material.

10. The phase change memory structure of claim 9, wherein the metal silicon nitride layer comprises tungsten silicon nitride, tantalum silicon nitride, niobium silicon nitride, molybdenum silicon nitride, titanium silicon nitride, or a combination thereof.

11. The phase change memory structure of claim 9, wherein the metal silicon nitride layer has a thickness from 10 Å to 300 Å.

12. The phase change memory structure of claim 1, wherein the bit line is formed of the metal, and wherein the bottom surface of the bit line connects to a top surface of the vertical via, wherein no metal silicon nitride layer is deposited on the top surface of the vertical via such that the bit line contacts the top surface of the vertical via by a metal-to-metal contact.

13. The phase change memory structure of claim 12, wherein the metal is tungsten, tantalum, niobium, molybdenum, titanium, or a combination thereof.

14. The phase change memory structure of claim 12, wherein the bit line bulges upward by 50 Å to 300 Å where the bit line wraps around the top surface of the vertical via.

15. The phase change memory structure of claim 12, wherein the first dielectric material and the second dielectric material are different materials.

16. The phase change memory structure of claim 15, wherein the first dielectric material is a carbon spin on dielectric and the second dielectric material is tetraethyl orthosilicate.

17. The phase change memory structure of claim 16, wherein the tetraethyl orthosilicate has a height variation of less than 150 Å.

18. A method of making a phase change memory structure, comprising:
    depositing material layers including a phase change material layer, a top electrode layer above the phase change material layer, a metal silicon nitride layer, and a metal layer in contact with the metal silicon nitride layer;
    dividing the material layers into a plurality of memory cells separated by a first dielectric material;
    depositing a vertical via separated from the plurality of memory cells by a second dielectric material, wherein the vertical via is formed of the metal;
    depositing a metal bit line in contact with the metal layer of the memory cells and the vertical via, wherein the metal bit line has a thickness greater than the thickness of the metal layer of the memory cells; and
    depositing a nitride cap layer over the nitride layer of the memory cells and over the first dielectric material after dividing the material layers into the plurality of memory cells, wherein the metal silicon nitride layer extends horizontally above the top electrode layer and is in contact therewith, the first dielectric material, the second dielectric material and the via extending above a top surface of the metal silicon nitride layer, and wherein the bit line has a non-flat bottom surface that contacts the top surface of the first dielectric material, a top surface of the second dielectric material, and a top surface of the via, and that further protrudes down from the top surface of the first dielectric material, the top surface of the second dielectric material, and the top surface of the via to the top surface of the metal silicon nitride layer.

19. The method of claim 18, wherein the metal bit line comprises tungsten, tantalum, niobium, molybdenum, titanium, or a combination thereof.

20. The method of claim 18, wherein the metal silicon nitride layer comprises tungsten silicon nitride, tantalum silicon nitride, niobium silicon nitride, molybdenum silicon nitride, titanium silicon nitride, or a combination thereof.

21. The method of claim 18, wherein the metal silicon nitride layer has a thickness from 10 Å to 300 Å.

22. The method of claim 18, wherein the metal layer has a thickness from 20 Å to 500 Å.

23. The method of claim 18, wherein the material layers further comprise a middle electrode layer below the phase change material layer, a select device layer below the middle electrode layer, a bottom electrode layer below the select device layer, and a word line layer below the bottom electrode layer.

24. The method of claim 18, wherein the memory cells are separated by a spin on dielectric.

25. The method of claim 18, further comprising depositing a nitride layer over the metal layer before dividing the material layers into the plurality of memory cells.

26. The method of claim 18, further comprising depositing tetraethyl orthosilicate adjacent to the plurality of memory cells, wherein the vertical via is deposited through the tetraethyl orthosilicate such that the tetraethyl orthosilicate is the second dielectric material separating the vertical via from the plurality of memory cells.

27. The method of claim 26, further comprising removing the nitride layer over the memory cells and a portion of the first dielectric material using a polishing operation adapted to stop on the metal layer of the memory cells.

* * * * *